(12) United States Patent
Tu et al.

(10) Patent No.: US 8,319,962 B2
(45) Date of Patent: *Nov. 27, 2012

(54) MASK MAKING DECISION FOR MANUFACTURING (DFM) ON MASK QUALITY CONTROL

(75) Inventors: Chih-Chiang Tu, Tauyen (TW); Chien-Chao Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/398,165

(22) Filed: Feb. 16, 2012

(65) Prior Publication Data

US 2012/0211675 A1   Aug. 23, 2012

Related U.S. Application Data

(63) Continuation of application No. 12/048,043, filed on Mar. 13, 2008, now Pat. No. 8,120,767.

(51) Int. Cl.
*G01N 21/00* (2006.01)
*G06K 9/00* (2006.01)

(52) U.S. Cl. ............... 356/237.5; 382/145; 382/147; 382/149

(58) Field of Classification Search ................. None
See application file for complete search history.

(56) References Cited

U.S. PATENT DOCUMENTS

| | | | |
|---|---|---|---|
| 5,995,200 | A | 11/1999 | Pierrat |
| 6,284,443 | B1 | 9/2001 | Anderson et al. |
| 6,654,488 | B1 | 11/2003 | Behun et al. |
| 2007/0292017 | A1 | 12/2007 | Cai et al. |

FOREIGN PATENT DOCUMENTS

| | | |
|---|---|---|
| JP | 11095405 | 4/1999 |
| JP | 2008226905 | 9/2008 |

OTHER PUBLICATIONS

Chinese Patent Office, Office Action dated Nov. 26, 2010, Application No. 200810211553.6, 5 pages.
Chinese Patent Office, Office Action dated Feb. 21, 2012, Application No. 200810211553.6, 5 pages.

*Primary Examiner* — Gregory J Toatley
*Assistant Examiner* — Amanda Merlino
(74) *Attorney, Agent, or Firm* — Haynes and Boone, LLP

(57) ABSTRACT

The present disclosure provide a method for making a mask. The method includes assigning a plurality of pattern features to different data types; writing the plurality of pattern features on a mask; inspecting the plurality of pattern features with different inspection sensitivities according to assigned data types; and repairing the plurality of pattern features on the mask according to the inspecting of the plurality of pattern features.

20 Claims, 8 Drawing Sheets

MASK MAKING DECISION FOR MANUFACTURING (DFM) ON MASK QUALITY CONTROL

The present application is a continuation application of U.S. patent application Ser. No. 12/048,043, filed Mar. 13, 2008 now U.S. Pat. No. 8,120,767, which is incorporated herein by reference in its entirety.

BACKGROUND

In semiconductor technologies, a plurality of photomasks (masks) are formed with predesigned integrated circuit (IC) patterns. The plurality of masks are used to transfer those predesigned IC patterns to multiple semiconductor wafers in lithography processes. The predesigned IC patterns formed on masks are master patterns. Any defect on a photomask will be transferred to multiple semiconductor wafers and cause yield issues. Therefore, the fabrication of a mask utilizes a high precision process. Further inspection and follow-up repair are also implemented to ensure that each mask is fabricated with high quality. However, various pattern features formed on a mask are designed for different functions. Existing practices on inspection and repairing of a mask can be overly stringent and lead to relatively low throughput and high manufacturing cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
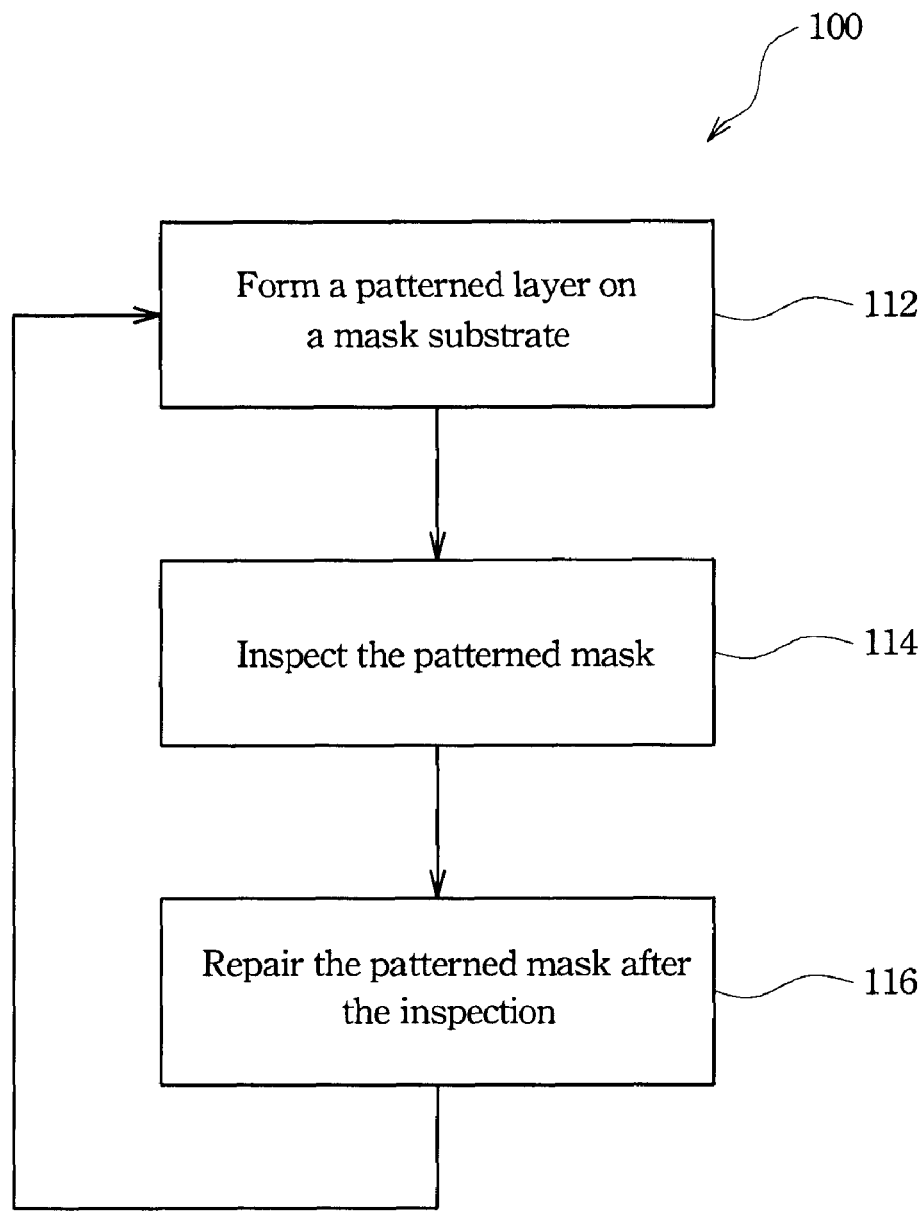
FIG. 1 is a flowchart of a method to make a mask according to one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of one embodiment of a method 100 which can be used to make a photomask (mask, or reticle, collectively referred to as mask). The method 100 is described below with additional reference to FIGS. 1 to 7, which shows a mask being constructed according to aspects of the present disclosure.

Figure 2A:
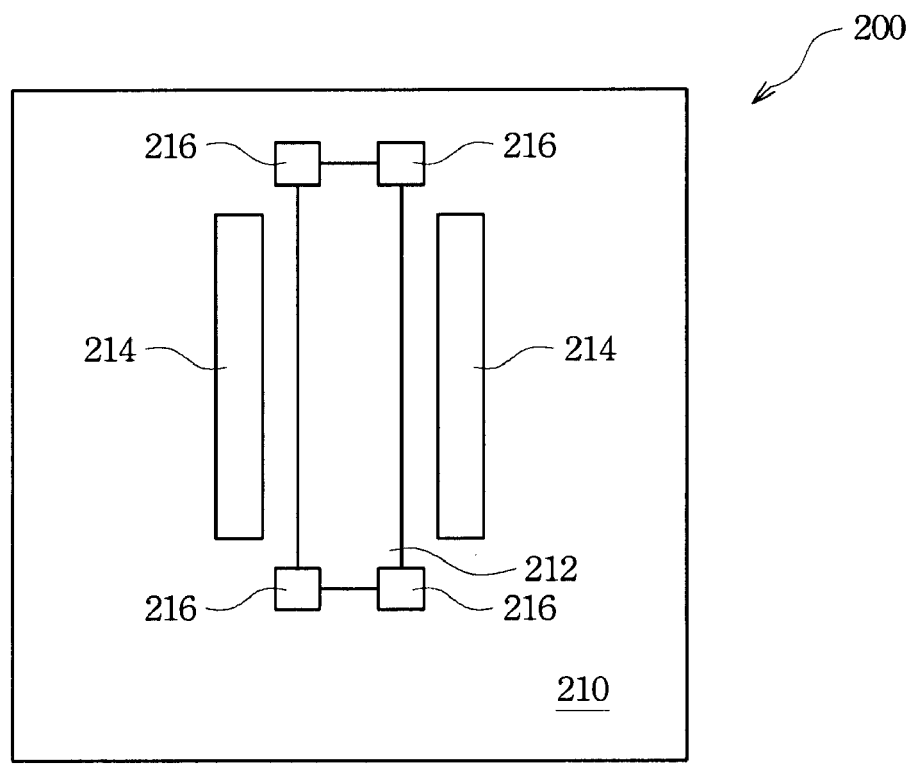
FIGS. 2a and 2b are top views of a mask constructed according to aspects of the present disclosure in various embodiments.

The method 100 begins at step 112 by writing a plurality of pattern features on a mask such as a mask 200, as illustrated in FIG. 2a. The mask 200 includes a transparent substrate 210 in one embodiment. The transparent substrate 210 may include fused silica ($SiO_2$), calcium fluoride ($CaF_2$), and/or other suitable materials. In the present embodiment, the mask substrate includes a fused quartz. A mask pattern is written on the transparent substrate. The mask pattern includes a plurality of pattern features such as those shown in FIGS. 2a and 2b. The mask pattern includes geometries of an integrated circuit pattern to be formed on a substrate such as a semiconductor wafer. In one embodiment, the mask includes an integrated circuit feature 212 as shown in FIG. 2a.

The mask pattern includes various assist features to enhance the quality and/or resolution of imaging during a photolithography process, in which the integrated circuit pattern is transformed to a substrate such as a semiconductor wafer. For example, a plurality of features are incorporated into the mask pattern and configured approximate an integrated circuit feature to compensate for optical proximity error using an optical proximity correction (OPC) technology. These features are also referred to as OPC features.

In one embodiment, the OPC features includes scattering bars 214 as illustrated in FIG. 2a. Scattering Bars are a proven and effective OPC technique that enhance wafer imaging performance for current and future technology nodes. Scattering bars can be sub-resolution features that are placed on a mask next to isolated lines and semi-isolated lines, enabling them to image like the dense lines.

In another embodiment, the OPC features include other assist features, such as serifs and hammerheads, for line-end treatment such as features 216 illustrated in FIG. 2a. Two related optical proximity effects are line end shortening and corner rounding, where the ends of lines tend to shrink from where the design specifies, and square corners on the mask are imaged as round corners on the wafer. Line-end treatment, such as in the form of serifs and hammerheads, stretches out the ends of lines on the mask so that the final imaged lines have the desired length, and sharp corners.

The OPC features may also include other suitable features to reduce the optical proximity effect. For example, due to the optical proximity effect, equal width lines image differently at different pitches, and isolated lines image differently than dense lines. Line biasing adjusts the width of lines on the reticle to compensate for this variation of line width across pitch. In another embodiment, OPC or other mask features may be incorporated into the mask pattern (mask layout) to compensate for the global pattern loading effect.

Figure 2B:
Figure 2B:
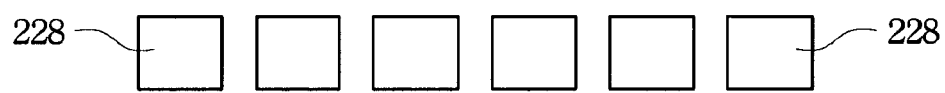
Figure 2B:

In another embodiment, the mask pattern may include dummy features incorporated into the integrated circuit features. For example, FIG. 2b shows a top view of an exemplary mask pattern 220 having various integrated circuit features 222, 224 and 226. The mask pattern 220 also includes a plurality of dummy features 228 configured approximate the integrated circuit features. In one embodiment, the dummy features are used to enhance a chemical mechanical polishing (CMP) process. For this purpose in one example, the dummy metal features are designed and incorporated into damascene structure to make pattern density more uniform to improve the planarization process. In other embodiments, the dummy features are used to improve pattern density, reduce deviations (e.g., "dishing") from a flat profile, and/or reduce etching loading effects.

The mask patterns may be formed on one or more absorption layers coated on the mask substrate 110. An absorption layer may include chromium (Cr), MoSi, and/or other suitable materials in various embodiments. The absorption layer is coated on the mask substrate and is then patterned to form the mask pattern.

In another embodiment, the mask pattern may at least partially include phase shift features, which is referred to as a phase shift mask (PSM). The mask pattern may be formed on one or more phase shift material layers coated on the mask substrate 110. For example, a phase shift material layer may also be an absorption layer and the phase shift material layer includes MoSi. In another embodiment, the phase shift material layer may be a transparent material coated on the mask substrate, and the phase shift layer includes silicon oxide. In another embodiment, the phase shift material layer includes a portion of the transparent mask substrate. For example, the mask pattern of the PSM is formed in the transparent fused quartz substrate.

A method to write the mask pattern to the mask may include resist patterning and etching processes. After a coated resist layer is patterned according to the designed mask pattern, an etching process is implemented to partially remove an underlying layer to transfer the resist pattern thereto. The underlying layer includes a coated absorption layer, a coated phase shift layer, and/or the transparent substrate. In the patterning process, the designed mask pattern is written on the absorption layer using a mask writing technique such as e-beam writing. Other writing methods such as ion beam writing may alternatively be used to form the mask pattern. During the etching process, etching rate and etching behavior may depend on a global etching pattern density, referred to as the global etching loading effect. The pattern density can be defined as the relative patterned feature areas. The global etching loading effect results in pattern dimension variation (or CD variation). For example to illustrate this, if a pattern feature at 30% pattern density targets 100 nm width after the etching process, then the same pattern at 20% pattern density may achieve 95 nm width and the same pattern at 40% pattern density may achieve 105 nm width. The CD variation relative to the ideal CD may be referred to as the global etching bias (or global loading bias). Generally, in addition to the global etching loading effect, a global pattern loading effect may also include other effects such as fogging effect during e-beam (EB) writing, and proximity effect. Although most examples in the disclosure are about the etching process, other processes such as EB writing and associated global effect may also be included and considered in the method 100 without departure of the spirit of the present disclosure. For simplicity, the etching process is described and illustrated here. The etching process may also include micro-loading effect associated with local pattern densities.

Figure 3A:
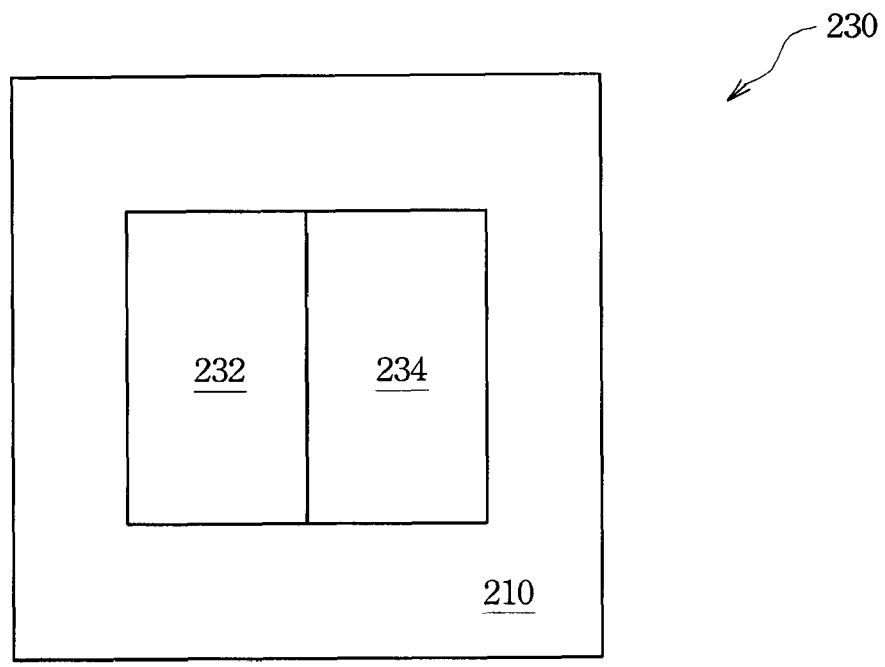
FIGS. 3a and 3b are top views of mask patterns constructed according to aspects of the present disclosure in various embodiments.

During the step 112 of writing a mask pattern to the mask 200, a dose map is implemented to tune local writing dose (energy) to compensate various loading effects and/or other location-dependent variations. In one example, the e-beam radiation duration on one spot is shortened or prolonged to vary the dose. In another embodiment, the e-beam intensity projected on one spot is tuned higher or lower to vary the dose. Referring to FIG. 3a, a mask 230 includes two regions 232 and 234 with different global densities. For example, the first region 232 has a global pattern density about 20% and the second region 234 has a global pattern density about 80%. The critical dimension (CD) over various doses can be found out through experiments such as an exemplary CD vs. dose diagram 244 illustrated in FIG. 3c. The doses for various global regions can be determined by using the CD vs. dose diagram. For example, the dose for the first region 232 can be extracted from the CD vs. dose diagram according to the global pattern density in the first region 232 and the associated global loading bias. The loading bias can also be obtained experiments. Thus obtained dose is assigned to the first region 232. Similarly, the dose for the second region 234 can also be extracted from the CD vs. dose diagram according to the global pattern density in the second region 234 and the associated global loading bias. That dose is assigned to the second region 234. Thus, a set of global doses for various regions can be determined and are referred to as a global dose map. The size of the global region cab be chosen. The global dose map can be used to implement the mask writing process with location dependent dose to compensate the global loading effect.

Figure 3B:
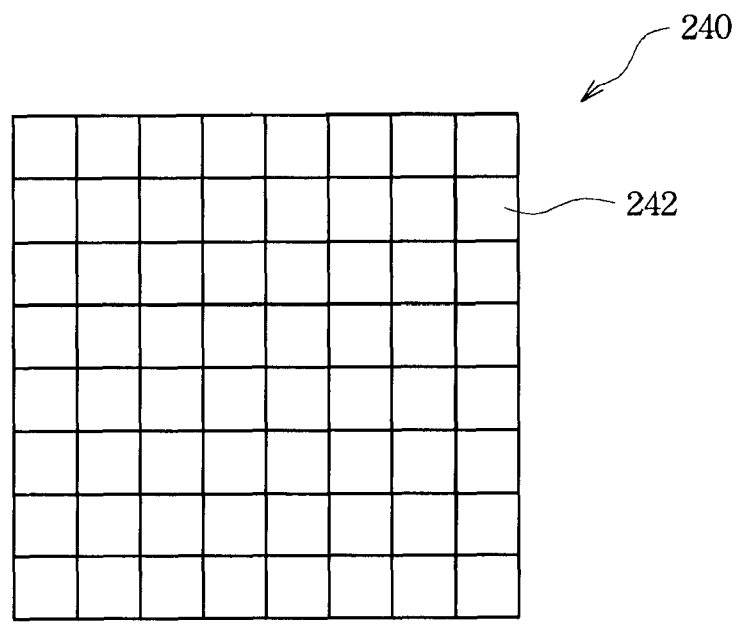
Figure 3C:
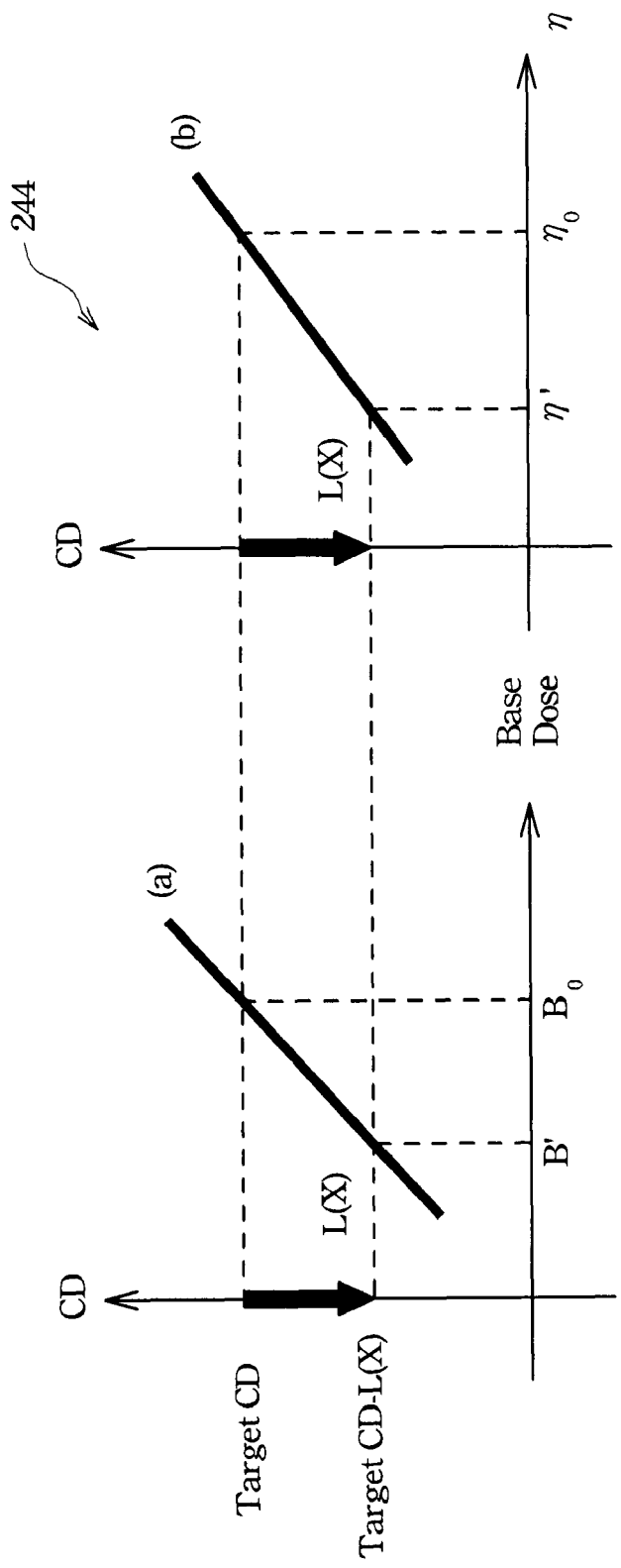
FIG. 3c is an exemplary diagram of critical dimension (CD) as compared to dosage.

Referring to FIG. 3b, a local dose map may also be similarly used. A mask 240 is divided into a plurality of regions 242, each region having its own local pattern density. The doses for various regions can be found out using the CD vs. dose diagram such as the CD vs. dose diagram 244. For example, the dose for one particular region can be extracted from the CD vs. dose diagram according to the associated pattern density to that particular region and the associated loading bias. Thus obtained dose is assigned to that particular region. Repeat the same procedure until the all regions 242 are exhausted. Thus, a set of doses mapping to the plurality of regions 242 are determined and are referred to as a local dose map. The size of the global region cab be properly chosen. This dose map can be used to implement the mask writing process with localized dose to each region to compensate the local loading effect. In one embodiment, the local dose map and global dose map can be combined into one dose map to reduce both global and local loading effects.

The mask making (or mask writing) tool, such as an e-beam writing tool, for mask writing process can be designed to include a dose map module and enable a dose map for mask writing process. For example, the writing tool is designed to determine the dose map for a mask pattern based the mask pattern, loading bias data, and the CD vs. dose diagram. In furtherance of the example, the dose map is saved in a database of the writing tool and is used to vary the dose from region to region accordingly during a writing process to form the mask pattern on a mask. The plurality of regions may be divided into different sizes depending on the criticality of each region.

Referring to FIGS. 1-2 and 4-6, the method 100 proceeds to step 112 by inspecting the plurality of mask pattern features formed on the mask. The mask inspecting process aims to identify mask defects for mask repair and enhancing mask fabrication yield. The inspecting process at this step utilizes multiple inspection criteria. As described above of FIGS. 2a and 2b, the mask pattern include various pattern features including integrated circuit features (main features), assist features, and dummy features. Each feature has its own sensitivity due to different criticalities to the mask pattern. For example, the main features are more sensitive to CD variation and need to be inspected with stringent criteria. In another example, the assist patterns may be less sensitive relative to the main features and need to be inspected using loose criteria. In another example, the dummy patterns may be much less sensitive relative to the main features and need to be inspected using even more loose criteria. The existing mask inspection process uses one criterion to inspect the all mask features, resulting false failure, high manufacturing cost (high inspection cost and high repairing cost) and low throughput.

In one embodiment, the multiple sensitivity inspecting process includes setting up pixel size (e.g., the size of a region) and threshold (e.g., inspection pass/fail criteria). Small pixel size may result in high inspection cost. Large pixel size may result in degraded inspection performance. Proper pixel size can be chosen based on the above two factors and/or other relevant factors. Each pixel may have different size and/or shape based on the sensitivity (or criticality) of each particular region and pattern features in that region. The threshold for each region (pixel) is chosen differently, more stringent or loose depending on the criticality of the region and pattern features in that region.

Figure 5:
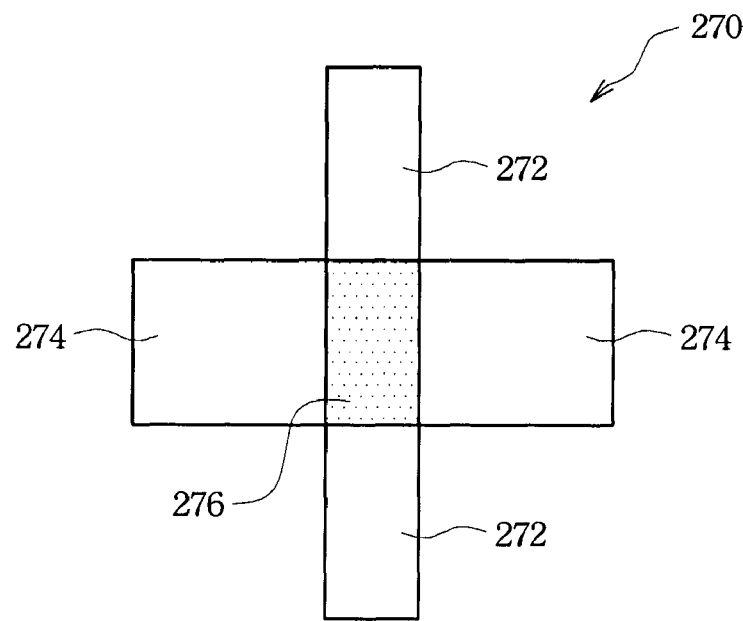
FIG. 5 is a top view of an exemplary mask pattern constructed according to aspects of the present disclosure in one embodiment.

The sensitivity is not only related to the type of features but also related to the device performance. Further, the sensitivity is related to the relationship between that feature and other features in the same region in an approximate layer when the mask pattern is transferred to a semiconductor wafer, and the criticality of the relationship. For example, FIG. 5 illustrates a pattern 270 formed on different masks and to be transferred the different layers in the same region of the semiconductor wafer. The pattern 270 includes a feature 272 and another feature 274. The mask pattern 270 also includes an overlap region 276. In one example for illustration, the pattern feature 272 is a feature to be formed in the polysilicon layer. The pattern feature 274 defines an active region in the semiconductor wafer. The overlap region 276 is more sensitive and needs a more stringent criteria during the mask inspection process. In furtherance of the example, the regions 272, 274, and 276 may have different sensitivities and therefore be assigned with different thresholds.

Figure 4:
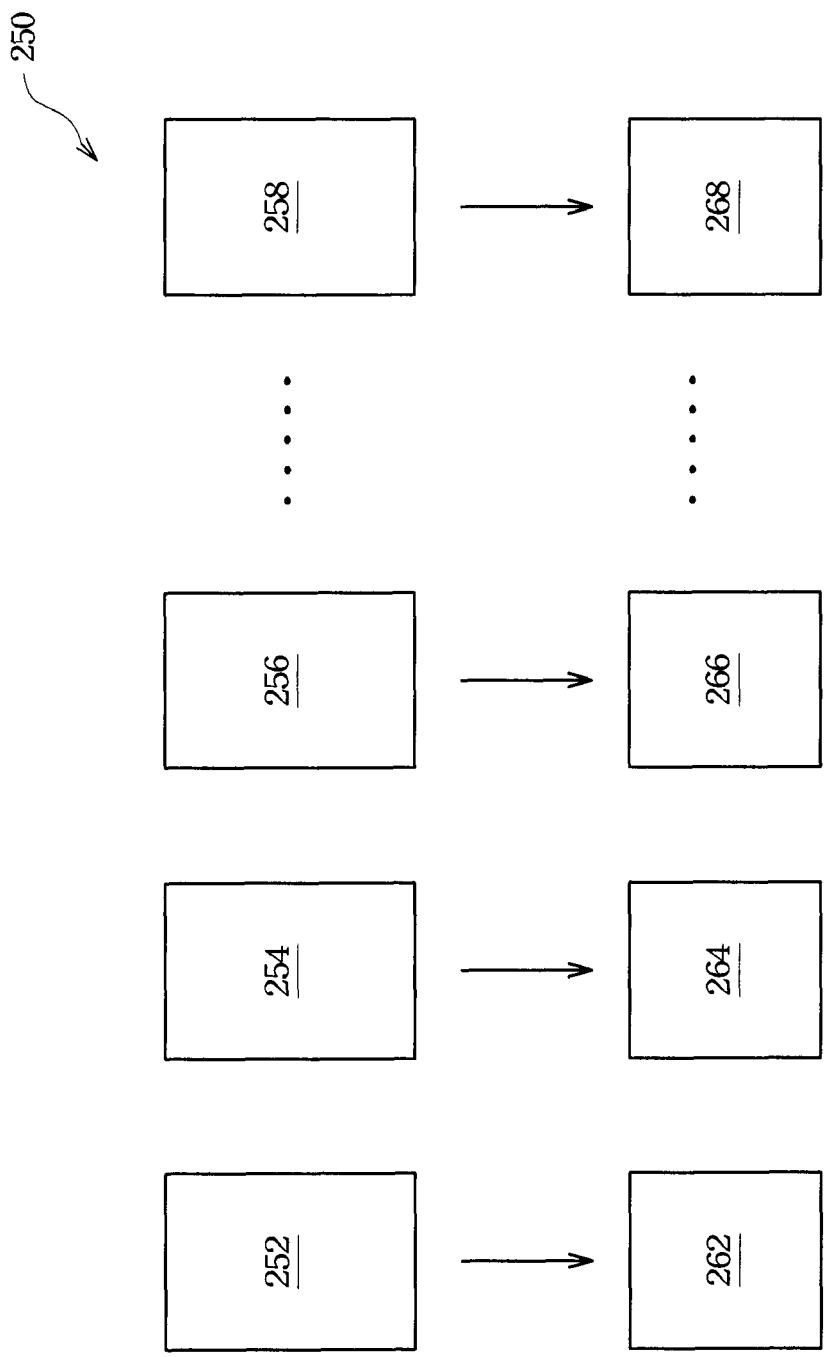
FIG. 4 is a block diagram of an exemplary multi-sensitivity inspection process constructed according to aspects of the present disclosure in one embodiment.

FIG. 4 is an exemplary block diagram of a multiple sensitivity inspection module 250, in one embodiment, constructed according to aspects of the present disclosure. The plurality pattern features in a mask pattern can be categorized into various sensitivity groups 252, 254, 256, 258 and so on. Each sensitivity group has its own pixel dimensions and inspection threshold. For example, the sensitivity group 252 has its pixel and threshold defined as pixel A and threshold A, respectively. The sensitivity group 254 has its pixel and threshold defined as pixel B and threshold B, respectively. The sensitivity group 256, pixel C and threshold C, and so on.

Figure 6A:
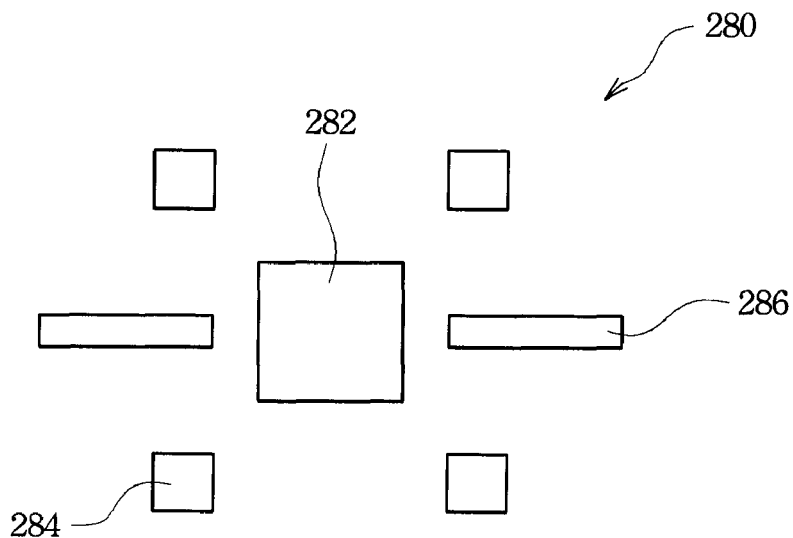
FIGS. 6a-6d are top views of an exemplary mask pattern constructed according to aspects of the present disclosure in one embodiment.
Figure 6B:
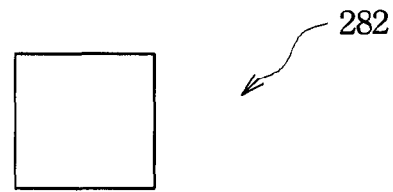
Figure 6C:
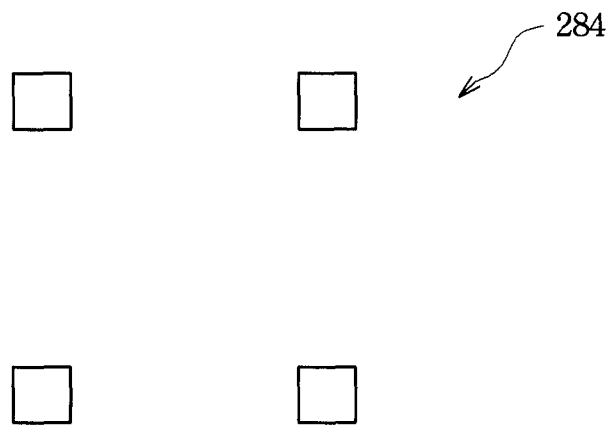
Figure 6D:
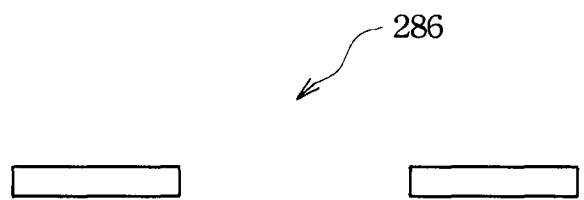

Referring to FIGS. 6a through 6d as top views of an exemplary mask pattern in one embodiment, categorization of the pattern features with different sensitivities is described for illustration. The mask pattern 280 in FIG. 6a includes a contact feature 282 and various scattering bars 284 and 286 positioned approximate the contact feature. In existing inspection procedures, all pattern features have one threshold setting with no differentiation. According to the present disclosure, each feature may be classified to a different sensitivity group and assigned with a different threshold. In one embodiment, the sensitivity (and/or threshold) may be represented by a data type and/or a data layer of a GDS document. GDS is a binary format for a mask layout tapeout. The GDS format includes a data layer and a data type (Data layer and data type are collectively referred to as data type whenever proper for simplicity). For example, the contact feature in GDS format may include a data layer as 31 and a data type 0 (gds: 31,0). Since the data type and data layer each has multiple values, they can be used to present the threshold of the pattern feature. In furtherance of the example, the contact feature 282 is categorized into a first sensitivity group, as illustrated in FIG. 6b and is represented by the data type 0. The scattering bars 284 are categorized into second sensitivity group, as illustrated in FIG. 6c and are represented by the data type 1. The scattering bars 286 are categorized into third sensitivity group, as illustrated in FIG. 6d and are represented by the data type 2. In furtherance of this example, if sensitivity is measured by 1 to 100 with highest sensitivity at 100. The contact feature 282 may be assigned with a sensitivity at 1 of as an example. The scattering bars 284 may be assigned with a sensitivity of 90. The scattering bars 286 may be assigned with a sensitivity of 80.

Figure 7A:
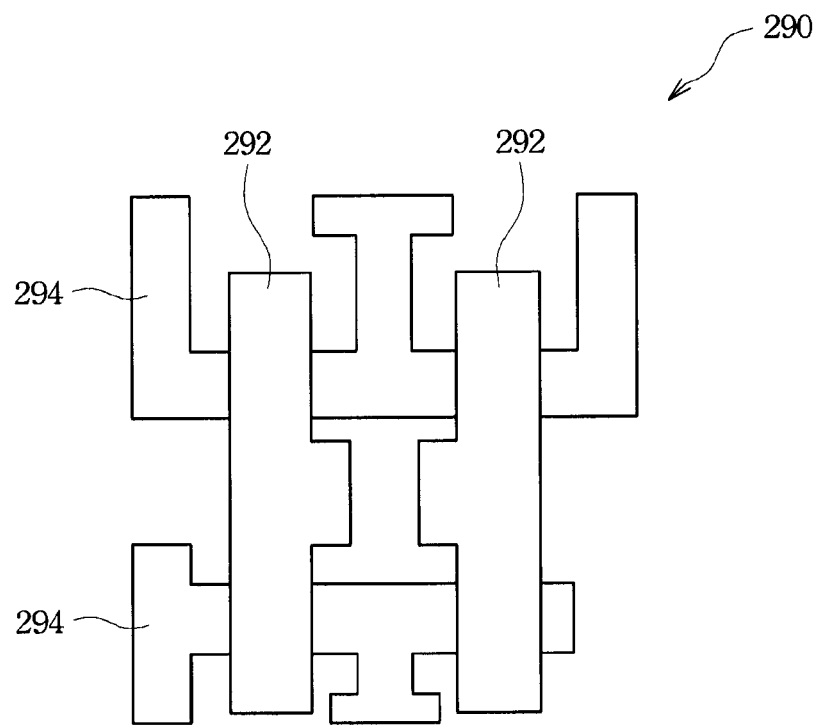
FIGS. 7a-7b are top views of an exemplary mask pattern constructed according to aspects of the present disclosure in one embodiment.
Figure 7B:
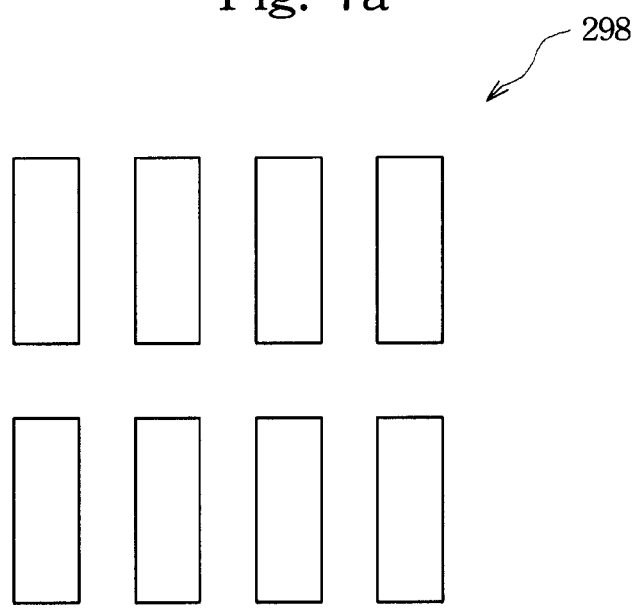

FIG. 7a illustrates a structure 290 having a polysilicon features 292 and active region features 294 formed in different masks. When the polysilicon features 292 have a data layer 17 and a data type 0 (gds: 17,0) while the active region features have a data layer 6 and a data type 0 (gds: 6, 0). The overlap region between the polysilicon features 292 and the active region features 294 have a different sensitivity that can be determined through an AND logic operation of "(6, 0) and (17, 0)", resulting in the gds: (50, 1). The sensitivity of polysilicon features that are not overlapped with the active region can be determined by a NOT logic operation of "(17, 0) not (6, 0)", resulting in the gds: (50, 2). Therefore, the overlapped region has a different sensitivity than that of non-overlapped polysilicon regions. FIG. 7b illustrates a plurality of dummy features 298. The gds data for the dummy features 298 may be (50, 0).

The inspection tool used to inspect the mask pattern written on the mask includes a customized sensitivity module to enable multiple sensitivity inspections of the mask pattern. The customized sensitivity module integrated with the inspection tool enables set up and inspection of thresholds and/or pixels, and also enables a two or more layers inspection process in which each pattern feature is determined of its sensitivity, considering multiple layers. The mask inspecting process includes utilizing an aerial image measurement system (AIMS) in one embodiment.

Referring again to FIG. 1, the method proceeds to step 116 by repairing the defects of the mask identified at the previous mask inspection step. The mask repairing process implements different accuracies to various pattern features according to their particular sensitivities. Various repairing tools are implemented to repair different pattern features according to their sensitivities. In one embodiment, different pixel may request different repairing tool. The less sensitive feature with large pixels may use less accurate repairing tool.

Referring to FIG. 4, the sensitivity group 252 uses the repairing rule 262 and associated repairing tools for repairing, and uses aerial image measurement system (AIMS) for imaging verification/check/inspection. The sensitivity group 254 uses repairing rule 264, and so forth. In one embodiment, the various repairing tools include e-beam repairing tool, atomic force microscope (MSF) micromachine, focused ion beam, and laser beam, each having a different accuracy. For example, the pattern features in the sensitivity group 252 may use e-beam repairing tool for mask repairing. The pattern features in the sensitivity group 254 may use AFM micromachine for mask repairing. The pattern features in the sensitivity group 256 may use focused ion beam for mask repairing. The pattern features in the sensitivity group 258 may use laser beam for mask repairing.

Thus, the present disclosure provides a method for making a mask. In one embodiment, the method includes writing a plurality of pattern features on the mask; inspecting the plurality of pattern features with different inspection sensitivities; and repairing the plurality of pattern features on the mask according to the inspecting of the plurality of pattern features. The method may further include assigning different data types and data layers, or various combinations thereof (or collectively referred to as data types) to the plurality of pattern features, to present the different inspection sensitivities.

In the method, the plurality of the pattern features may include a first pattern feature associated with a first inspection sensitivity; and a second pattern feature associated with a second inspection sensitivity lower than the first inspection sensitivity. The first pattern feature may include a device feature (an integrated circuit feature). The second pattern feature may include one element selected from the group consisting of an optical proximity correction (OPC) feature and a dummy pattern. The first pattern feature may include an association with at least one pattern layer to be formed on another mask and transferred to an adjacent layer on a semiconductor substrate.

The repairing of the plurality of pattern features may include repairing the first pattern feature using a first repairing accuracy; and repairing the second pattern feature using a second repairing accuracy lower than the first repairing accuracy. The repairing of the plurality of pattern features may include repairing each of the plurality of pattern features using one repairing tool selected from the group consisting of e-beam repairing tool, atomic force microscope (AFM) micromachine, focused ion beam tool and laser beam tool, according to an associated repairing accuracy. The inspecting of the plurality of pattern features may include utilizing an aerial image measurement system (AIMS). The writing of the plurality of pattern features may include writing each of the plurality of pattern features using a dose according to a loading factor dose map associated to the mask.

The present disclosure also provides a mask making tool. In one embodiment, the inspection tool includes a sensitivity module designed to assign pattern features to different data types, each associated with one of a plurality of sensitivities; and an inspection unit designed to repair the pattern features according to associated sensitivities.

In the mask inspection tool, each of the plurality of sensitivities may be characterized by at least one of threshold and pixel. The sensitivity module may be operable to assign a pattern feature with one of the plurality of sensitivities according to performance criticality of the pattern feature. The repairing unit may include one selected from the group consisting of e-beam repairing tool, atomic force microscope (AFM) micromachine, focused ion beam tool and laser beam tool.

The present disclosure also provides a mask making system. In one embodiment, the mask making system includes a mask writing unit designed to write pattern features on a mask; and a loading factor dose module designed to assign one of the pattern features with a particular dose according to a loading factor dose map.

The present disclosure also provides another mask making system. In one embodiment, the mask making system includes a loading factor dose module designed to assign pattern features with various doses according to a loading factor dose map; a mask data module designed to associate the pattern features with different data types according to assigned doses; and a mask writing unit designed to write the pattern features according to associated data types.

In various embodiments of the disclosed mask making system, the mask making system may further include a mask inspection unit designed for inspecting according to various inspection sensitivities. The mask making system may further include a mask repairing unit designed for repairing the pattern features using various repairing accuracies. The particular dose may be assigned further based on layout proximity factor of the pattern features. The loading factor dose module may be operable to provide a first dose map readable by the mask writing unit and a second dose map readable by an engineer.

In various embodiments, a plurality of pattern features are assigned with different data types and/or different data layers (or collectively referred to as different data types) to represent different writing doses, different inspection sensitivities, different repairing accuracies, or combinations thereof. Therefore, the mask making system and method can perform a writing with a particular dose, an inspection with a particular sensitivity, and/or a repairing process with a particular accuracy according the assigned data type.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A mask making tool, comprising:
    an inspection unit operable to identify a first pattern feature and a second pattern feature associated with a first mask, the first pattern feature overlapping a third pattern feature associated with a second mask when the first pattern feature and the third pattern feature are transferred to a semiconductor substrate, and
    wherein the inspection unit inspects the first pattern feature with a first inspection sensitivity and the second pattern feature with a second inspection sensitivity, the first inspection sensitivity being different than the second inspection sensitivity.

2. The mask making tool of claim 1, wherein the inspection unit inspects a portion of the first pattern feature that overlaps the third pattern feature associated with the second mask at a third inspection sensitivity that is different than the first inspection sensitivity.

3. The mask making tool of claim 1, wherein the first inspection sensitivity uses a first pixel size for inspection of the first pattern feature and the second inspection sensitivity uses a second pixel size for inspection of the second pattern feature, the first pixel size being different than the second pixel size.

4. The mask making tool of claim 1, wherein the first inspection sensitivity is associated with a first inspection threshold and the second inspection sensitivity is associated with a second inspection threshold, the first inspection threshold being based on a first degree of a criterion and the second inspection threshold being based on a second degree of the criterion, the first degree of the criterion being different than the second degree of the criterion.

5. The mask making tool of claim 1, wherein the inspection unit is operable to repair the first and second pattern features using different levels of accuracy.

6. The mask making tool of claim 5, wherein the inspection unit is operable to repair the first and second pattern features according to an associated repairing accuracy using at least one repairing tool selected from the group consisting of e-beam repairing tool, atomic force microscope (AFM) micromachine, focused ion beam tool and laser beam tool.

7. The mask making tool of claim 1, further comprising a mask writing unit operable to write the first and second pattern features to the first mask according to a data type associated with the first and second pattern features.

8. The mask making tool of claim 1, further comprising a sensitivity module operable to associate the first pattern feature with a first data type and the second pattern feature with a second data type, the first data type being associated with the first inspection sensitivity and the second data type being associated with the second inspection sensitivity.

9. A mask making system, comprising:
a mask writing unit operable to write a first pattern feature and a second pattern feature to a first mask; and
an inspection unit operable to identify the first pattern feature and the second pattern feature associated with the first mask, the first pattern feature overlapping a third pattern feature associated with a second mask when the first pattern feature and the third pattern feature are transferred to a substrate, wherein the inspection unit inspects the first pattern feature with a first inspection sensitivity and the second pattern feature with a second inspection sensitivity, the first inspection sensitivity being different than the second inspection sensitivity.

10. The mask making system of claim 9, further comprising:
a loading factor dose module operable to assign various doses to the first pattern feature and the second pattern feature according to a loading factor dose map; and
a mask data module operable to associate the first pattern feature with a first data type and the second pattern feature with a second data type according to assigned doses,
wherein the mask writing unit writes the first pattern feature according to the first data type and the second pattern feature according to the second data type.

11. The mask making system of claim 10, wherein the loading factor dose module assigns the first pattern feature and the second pattern feature with the various doses according to a layout proximity factor of the first and second pattern features.

12. The mask making system of claim 9, wherein the first and second inspection sensitivities are characterized by at least one of threshold and pixel size.

13. The mask making system of claim 9, wherein the first inspection sensitivity uses a first pixel size for inspection of the first pattern feature that is different from a second pixel size used for inspection of the second pattern feature.

14. The mask making system of claim 9, a repair unit operable to repair the first and second pattern features based on the inspection of the first pattern feature using the first inspection sensitivity and the second pattern feature using the second inspection sensitivity.

15. A method comprising:
identifying a first pattern feature and a second pattern feature associated with a mask, the first pattern feature overlapping a third pattern feature associated with a second mask when the first pattern feature and the third pattern feature are transferred to a substrate;
writing the first pattern feature and the second pattern feature on the first mask; and
inspecting the first pattern feature and the second pattern feature with different inspection sensitivities.

16. The method of claim 15, further comprising repairing the first pattern feature and the second pattern feature on the first mask according to the inspecting of the first pattern feature and the second pattern feature.

17. The method of claim 16, wherein repairing the first pattern feature and the second pattern feature on the first mask includes repairing the first pattern feature at a first repairing accuracy and repairing the second pattern feature at a second repairing accuracy that is different from the first repairing accuracy.

18. The method of claim 15, wherein inspecting the first pattern feature and the second pattern feature with different inspection sensitivities includes inspecting the first pattern feature using a first pixel size that is different than a second pixel size used to inspect the second pattern feature.

19. The method of claim 15, wherein inspecting the first pattern feature and the second pattern feature with different inspection sensitivities includes inspecting a first portion of the first pattern feature that overlaps the third pattern feature associated with the second mask with a first inspection sensitivity and inspecting a second portion of the first pattern feature that is non-overlapping the third pattern feature with a second inspection sensitivity that is different than the first inspection sensitivity.

20. The method of claim 19, wherein inspecting the first pattern feature and the second pattern feature with different inspection sensitivities includes inspecting the second pattern feature with a third inspection sensitivity that is different than the first and second inspection sensitivities.

* * * * *